United States Patent [19]

Izu et al.

[11] 4,443,652

[45] Apr. 17, 1984

[54] ELECTRICALLY INTERCONNECTED LARGE AREA PHOTOVOLTAIC CELLS AND METHOD OF PRODUCING SAID CELLS

[75] Inventors: Masatsugu Izu, Southfield; Prem Nath, Rochester; Arthur Holland, Washington, all of Mich.

[73] Assignee: Energy Conversion Devices, Inc., Troy, Mich.

[21] Appl. No.: 440,385

[22] Filed: Nov. 9, 1982

[51] Int. Cl.$^3$ .................. H01L 31/04; H01L 31/18
[52] U.S. Cl. ............................ 136/251; 136/244; 136/258; 29/572; 357/30
[58] Field of Search ............. 136/244, 251, 258 AM, 136/249 MS; 29/572; 357/30

[56] References Cited

U.S. PATENT DOCUMENTS 2,820,841  1/1958  Carlson et al. ............... 136/258
4,400,409  8/1983  Izu et al. ........................ 427/39

FOREIGN PATENT DOCUMENTS 56-69873  6/1981  Japan .................... 136/258 AM Primary Examiner—Aaron Weisstuch
Attorney, Agent, or Firm—Marvin S. Siskind

[57] ABSTRACT

Electrical interconnections for a large area photovoltaic cells, electrical interconnections for adjacent large area photovoltaic cells and the methods of producing those connections are disclosed herein. The cells are, preferably, of the type which include a plurality of electrically isolated, small area segments sharing a common substrate, a semiconductor body atop the substrate and a transparent, conductive coating atop the semiconductor body. The electrical interconnections include: an electrically-conductive strip interconnecting the small area segments of each large area to provide a first electrode of that cell; and access to the substrate from the layered surface of each large area cell to provide the second electrode of that cell. The electrodes may be electrically-interconnected in series or parallel.

48 Claims, 10 Drawing Figures

ELECTRICALLY INTERCONNECTED LARGE AREA PHOTOVOLTAIC CELLS AND METHOD OF PRODUCING SAID CELLS

FIELD OF THE INVENTION

This invention relates generally to large area photovoltaic cells and more particularly to (1) electrically interconnected large area photovoltaic cells; and (2) adjacent, electrically-interconnected large area photovoltaic cells. Also disclosed are the methods of producing said electrically connected and electrically-interconnected, large area photovoltaic cells.

BACKGROUND OF THE INVENTION

Described herein are discrete, electrically-interconnected large area photovoltaic cells and adjacent, electrically-interconnected, large area photovoltaic cells. Also discussed as a principal feature of the present invention is the fabrication of a large area photovoltaic cell from a plurality of electrically-isolated, small area segments which must be electrically-interconnected to provide an electrically-operable large area solar cell. Another principal feature of the present invention is the fabrication of a plurality of adjacent, electrically-interconnected, large area solar cells from a plurality of discrete large area photovoltaic cells.

Although crystal silicon devices are the basis of the huge semiconductor industry, devices made from crystal silicon have fixed parameters which are not variable as desired, require large amounts of material, are only producible in relatively small areas and are expensive and time consuming to produce. Devices based upon amorphous silicon can eliminate these crystal silicon disadvantages. Amorphous silicon has an optical absorption edge having properties similar to a direct gap semiconductor and only a material thickness of one micron or less is necessary to absorb the same amount of sunlight as the 50 micron thick crystalline silicon. Further, amorphous silicon can be made faster and more easily in larger areas than can crystalline silicon.

Accordingly, a considerable effort has been made to develop processes for readily depositing amorphous semiconductor alloys or films, each of which can encompass relatively large areas, if desired, limited only by the size of the deposition equipment, and which could be readily doped to form p-type and n-type materials when p-n junction devices are to be made therefrom equivalent to those produced by their crystalline counterparts.

Greatly improved amorphous silicon alloys having significantly reduced concentrations of localized states in the energy gaps thereof and high quality electronic properties have been prepared by glow discharge decomposition as fully described in U.S. Pat. No. 4,226,898, Amorphous Semiconductors Equivalent to Crystalline Semiconductors, issued in the names of Stanford R. Ovshinsky and Arun Madan on Oct. 7, 1980, and by vapor deposition as fully described in U.S. Pat. No. 4,217,374, issued in the names of Stanford R. Ovshinsky and Masatsugu Izu on Aug. 12, 1980, under the same title. As disclosed in these patents, which are incorporated herein by reference, fluorine is introduced into the amorphous silicon semiconductor to substantially reduce the density of localized states therein. It is believed that the activated fluorine readily diffuses into and bonds to the amorphous silicon in the amorphous body to substantially decrease the density of localized defect states therein, because the small size of the fluorine atoms enables them to be readily introduced into the amorphous body. The fluorine bonds to the dangling bonds of the silicon and forms what is believed to be a partially ionic stable bond with flexible bonding angles, which results in a more stable and more efficient compensation or alteration than is formed by hydrogen and other compensating or altering agents. Fluorine is considered to be a more efficient compensating or altering element than hydrogen when employed alone or with hydrogen because of its exceedingly small size, high reactivity, specificity in chemical bonding, and highest electronegativity.

It is now known that the efficiency of a photovoltaic device may be enhanced by stacking cells atop of each other. This concept of utilizing multiple cells, to enhance photovoltaic device efficiency, was discussed at least as early as 1955 by E. D. Jackson in U.S. Pat. No. 2,949,498, which issued on Aug. 16, 1960. The multiple cell structures therein discussed utilized p-n junction crystalline semiconductor devices. Essentially, the concept is directed to utilizing different band gap devices to more efficiently collect various portions of the solar spectrum and to increase open circuit voltage (Voc.). The tandem cell device has two or more cells with the light directed serially through each cell, with a large band gap material followed by a smaller band gap material to absorb the light passed through the first cell or layer. By substantially matching the generated currents from each cell, the overall open circuit voltage of each cell may be added, thereby producing a device which makes full use of the energy produced by incoming light.

It is of obvious commercial importance to be able to mass produce photovoltaic devices. Unlike crystalline silicon which is limited to batch processing for the manufacture of solar cells, amorphous silicon alloys can be deposited in multiple layers over relatively large area substrates to form solar cells in a high volume, continuous processing system. Continuous processing systems of this kind are disclosed, for example, in pending patent applications: Ser. No. 151,301, filed May 19, 1980, for A Method of Making P-Doped Silicon Films and Devices Made Therefrom, now U.S. Pat. No. 4,400,409; Ser. No. 244,386, filed March 16, 1981 for Continuous Systems for Depositing Amorphous Semiconductor Material; Ser. No. 240,493, filed Mar. 16, 1981 for Continuous Amorphous Solar Cell Production System; Ser. No. 306,146, filed Sept. 28, 1981 for Multiple Chamber Deposition and Isolation System and Method; and Ser. No. 359,825, filed Mar. 19, 1982 for Method and Apparatus for Continuously Producing Tandem Photovoltaic Cells. As disclosed in these applications, a substrate may be continuously advanced through successive triads of deposition chambers, wherein each chamber is dedicated to the deposition of a specific material. In making a solar cell of p-i-n type configuration, the first chamber of each triad is dedicated for depositing a p-type amorphous semiconductor material, the second chamber of each triad is dedicated for depositing an intrinsic semiconductor material, and the third chamber of each triad is dedicated for depositing an n-type amorphous semiconductor material.

The resultant roll of large area photovoltaic cells manufactured by the mass production glow discharge deposition technique described hereinabove, comprises an elongated strip of substrate upon which successive semiconductor layers are deposited. It is well known that following the deposition of the semiconductor layers, a further step must be performed in order to complete fabrication of an operable, semiconductor device. In this step, a transparent, electrically-conductive coating, which is characterized by high light-transmissivity and high electrical-conductivity, is deposited atop the semiconductor body. This elongated roll of photovoltaic material must now be processed to form therefrom a plurality of large area photovoltaic cells adapted for either series or parallel electrical interconnections.

The present invention deals with the electrical connections within and the electrical interconnections between large area photovoltaic cells. It also relates to a method of electrically interconnecting the plurality of electrically-isolated, small area segments into which the large area solar cell may be divided and provides an interconnection technique particularly adapted for assembly line production. Likewise, another concept of the present invention pertains to a method of electrically-interconnecting adjacent large area photovoltaic devices, said method also being specially adapted for assembly line production. These methods are characterized by simplicity of operation, economy of material and savings of production time as compared to the electrical connection techniques of the prior art. Note that, although a photovoltaic cell having an amorphous semiconductor body including fluorine has been described hereinabove, the present invention is not limited to amorphous semiconductors fabricated from specific process gases. Moreover, this application is equally adapted for use with photovoltaic cells of any composition, whether (1) amorphous, crystalline or polycrystalline; or (2) including fluorine. A U.S. patent application filed Sept. 23, 1982, entitled Compositionally Varied Materials And Method For Synthesizing The Materials and assigned to the same assignee as the instant patent application, provides a basis for obtaining photovoltaic quality response from materials previously tried and discarded or synthesized new materials.

U.S. patent application Ser. No. 347,779 filed Feb. 11, 1982 in the name of Prem Nath, entitled IMPROVED SOLAR CELL AND METHOD FOR PRODUCING SAME, discloses a method for subdividing a large area photovoltaic cell into a plurality of electrically-isolated, small area segments which are then electrically interconnected so as to provide an improved, high efficiency, large area photovoltaic cell. The present application, inter alia, is an improved method for economically and efficiently interconnecting these small area segments so as to form a large area photovoltaic cell, and a method for electrically interconnecting those large area cells to form adjacent electrically-interconnected large area cells. The electrically-interconnected large area photovoltaic cells so produced may be used to supply electrical power for residential or commercial consumption. Further, the electrical connections and interconnections, disclosed herein, provide for a series of pre-connected cells to be severed from an elongated strip of cells, so as to match the power requirements of a particular consumer.

The many objects and advantages of the present invention will become clear from the drawings, the detailed description of the invention and the claims which follow.

BRIEF SUMMARY OF THE INVENTION

One preferred embodiment of the present invention concerns the preparation, for electrical interconnection, of a large area photovoltaic cell, which is divided into a plurality of electrically-isolated, small area segments sharing a common substrate. Each of the small area segments includes a plurality of semiconductor layers atop one surface of the common substrate and a transparent, conductive coating atop the semiconductor layers. A plurality of spaced, electrically-conductive busbars are electrically connected to the plurality of small area segments. Each of the busbars terminates on the same portion of the surface of a large area cell, that portion being electrically insulated to prevent short circuiting of the busbars against the substrate disposed therebelow. An elongated electrically-conductive strip electrically interconnects each of the plurality of spaced busbars. Electrical access to the substrate is provided from the upper, layered surface of the large area cell, whereby the access to the substrate provides the first electrode of the large area photovoltaic cell and the metallic strip provides the second electrode of the large area photovoltaic cell. The electrical access to the substrate is provided either by one or more electrically-conductive rivets or by one or more exposed sections of the layered surface of the substrate. Regardless of the type of electrical access provided, the substrate is sufficiently accessible to enable the large area cell to be connected either in series or parallel. Finally, the cell may be encapsulated between upper and lower protective coverings with only connections to the electrodes thereof extending therefrom.

Also discussed and claimed herein are adjacent, electrically-interconnected large area photovoltaic cells in which each cell is divided into a plurality of electrically-isolated small area segments sharing a common, substrate. A plurality of spaced, electrically-conductive busbars electrically interconnect the small area segments of the discrete large area cells. Each small area segment includes a plurality of semiconductor layers atop one surface of the common substrate and a transparent, conductive coating atop the semiconductor layers. Each of the busbars of each large area cell terminates on the same portion of the surface of the associated large area cell, that portion being electrically insulated to prevent short circuiting of the busbars against the substrate. An elongated metallic, electrically-conductive, strip electrically connects the busbars of each discrete large area cell. Electrical access to the common substrate of each large area cell is provided from the upper, layered surface of that cell, whereby the accessible substrates and the elongated metallic strips of adjacent large area cells are electrically interconnected to electrically interconnect those large area cells. The busbars of each discrete large area cell terminate within a peripheral border portion of that cell. Electrical access to the substrate may be provided either by electrically-conductive rivets secured within the peripheral border portion of that cell or by an exposed section of the peripheral border portion. In either event, the substrate is sufficiently accessible to provide for series or parallel electrical connection of adjacent large area cells.

There is also detailed in the present application a method for providing electrical connections to and from a discrete large area photovoltaic cell. The cell comprises (1) a plurality of electrically-isolated small area segments sharing a common substrate, a plurality of semiconductor layers atop one surface of the substrate and a transparent, conductive coating atop the semiconductor layers; and (2) a plurality of spaced, electrically-conductive busbars electrically connected to the small area segments. The method includes the steps of (1) terminating each busbar within the same portion of the large area cell; (2) electrically insulating the busbar terminating portion of the large area cell to prevent short circuiting; (3) providing electrical access to the common substrate from the layered surface of the large area cell with electrical access means; and (4) electrically interconnecting the busbars of the large area cell with an elongated, electrically-conductive metallic strip; whereby the electrical access to the substrate provides a first electrode of the large area photovoltaic cell and the metallic strip provides a second electrode of the large area photovoltaic cell. An additional step may include providing access to the substrate with either one or more electrically-conductive rivets, or one or more exposed portions of the upper, layered surface of the substrate. In either event, the electrical connection may be made in a series or parallel fashion.

Finally, disclosed herein is a method of electrically interconnecting adjacent large area photovoltaic cells, each cell comprising a plurality of electrically-isolated, small area segments sharing a common substrate and a plurality of semiconductor layers atop one surface of the substrate and a transparent, conductive coating atop the semiconductor layers. A plurality of spaced, electrically-conductive busbars are electrically connected to the small area segments. The method includes the steps of: (1) terminating each busbar of each discrete large area cell within the same portion of that large area cell; (2) electrically insulating the busbar terminating portion of each large area cell to prevent short circuiting; (3) providing electrical access to the common substrate of each large area cell from the layered surface of that large area cell; (4) electrically interconnecting the busbars of each discrete large area cell with an elongated, electrically-conductive metallic strip; and (5) electrically interconnecting the metallic strip and the accessible substrate of adjacent large area cells to electrically interconnect those large area photovoltaic cells. In the foregoing method, as with the previous products and methods, electrical connection to the substrate may be made by either exposing one or more sections of the substrate or by securing one or more electrically-conductive rivets to the substrate. In either event, the number of rivets or exposed sections of the substrate depend upon whether a series or parallel connection is desired.

DETAILED DESCRIPTION OF THE DRAWINGS

I. The Tandem Photovoltaic Cell

Figure 1:
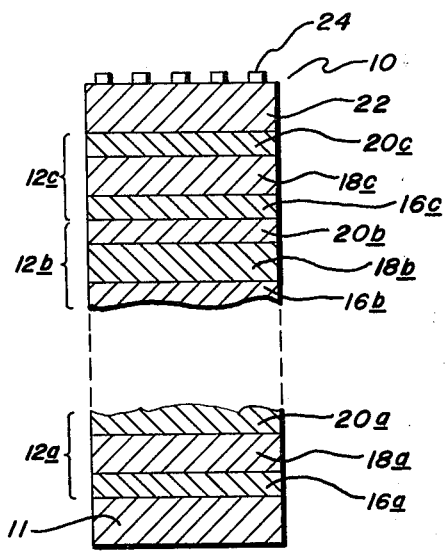
FIG. 1 is an enlarged, fragmentary, cross-sectional view of a photovoltaic cell comprising a plurality of p-i-n type cells, each layer of the cells preferably formed of an amorphous semiconductor alloy.

Referring now to the drawings, and particularly to FIG. 1, a stacked, tandem or cascade-type, photovoltaic cell, formed of successive p-i-n layers, each layer formed from an amorphous semiconductor alloy and including an transparent, conductive coating, is shown generally by the reference numeral 10. The methods described herein are not limited solely to the production of stacked p-i-n photovoltaic cells, but are of equal value in the production of improved Schottky or improved MIS (metal-insulator-semiconductor) type cells or simply the production of improved semiconductor devices. Regardless of cell type, the large area cells and the production techniques which are detailed in this specification find utility with photovoltaic cells formed with layers of semiconductor materials and with a transparent, conductive layer deposited atop the semiconductor layers.

More particularly, FIG. 1 shows a plurality of p-i-n solar cells 12a, 12b, and 12c. Below the lowermost cell 12a, is a substrate 11 which may be a transparent conductive layer or formed from a metallic surface foil. Since certain applications may require a thin oxide layer and/or a series of base contacts prior to the application of the semiconductor material, for the purpose of this application the term substrate shall include not only a flexible film but also any elements added thereto by preliminary processing. Most commonly, the substrate 11 may be formed of stainless steel, aluminum, tantalum, molybdenum, or chrome. However, other materials may be used, including, specifically, a glass insulating base having an electrically conductive layer applied thereon.

Each of the cells 12a, 12b and 12c include a semiconductor body containing, in one embodiment, at least a silicon alloy. Each of the alloy bodies includes an n-type conductivity semiconductor or layer 20a, 20b and 20c;

an intrinsic semiconductor layer 18a, 18b, and 18c; and a p-type conductivity semiconductor or layer 16a, 16b and 16c. As illustrated, cell 12b is an intermediate cell and, as indicated in FIG. 1, additional intermediate cells may be stacked upon the illustrated cells without departing from the spirit or scope of the present invention. Whereas, in the preferred embodiment of the present invention, an amorphous semiconductor alloy, which includes flourine, is used to form each of the layers of the cells 12, the layers could also be formed of crystalline or polycrystalline materials, with or without the addition of flourine. The inventive concepts disclosed herein are applicable to photovoltaic cells, regardless of materials or crystallinity.

For each of the cells 12a, 12b and 12c, the p-type semiconductor layers 16a, 16b, 16c are ideally low tight absorption, high conductivity layers. The intrinsic semiconductor layers 18a, 18b, 18c are characterized by an adjusted wavelength threshold for a solar photoresponse, high light absorption, low dark conductivity, and high photoconductivity, and include sufficient amounts of a band gap adjusting element or elements to optimize the band gap for the particular cell application. Preferably the intrinsic layers are band gap adjusted to provide cell 12a with a lowest band gap, cell 12c with the highest band gap, and cell 12b with a band gap between the other two. The n-type layers 20a, 20b, and 20c are characterized by low light absorption, high conductivity alloy materials. The thickness of the n-type layers is preferably in the range of about 25 to 100 angstroms. The thickness of the band gap adjusted amorphous intrinsic alloy layer is preferably between about 2000 angstroms to 3,000 angstroms. The thickness of the p-type layers is preferably between 50 to 500 angstroms. Due to the shorter diffusion length of the holes, the p-type layers generally will be as thin as possible. Further, the outermost layer, here the p-type layer 20c, will be as thin as possible to avoid absorption of light and need not include the band gap adjusting element or elements.

It is to be understood that following the deposition of the semiconductor layers, a further deposition step is performed. In this step, a continuous or discontinuous, transparent, conductive layer 22 of high electrical conduction and high light transmissivity is added atop the n-type layer 20c. This transparent, conductive layer 22 may, for example, be a thin, 500 angstroms thick film of indium tin oxide, (ITO), cadmium stannate ($Cd_2SnO_4$), or doped tin oxide ($SnO_2$). Although grid patterns 24 are routinely added to the transparent, conductive material, for applications involving a sufficiently small area solar cell, the transparent, conductive coating 22 is generaly sufficiently conductive such that a grid pattern 24 is not necessary. However, for applications such as the present one in which large area (one square foot) solar cells are fabricated, a grid pattern 24 is applied atop the transparent, conductive layer 22 to shorten the carrier path and increase the conduction efficiency thereof. This transparent, conductive layer 22, being applied directly atop the semiconductor layers, serves as a top electrode for the photovoltaic device 10, with the conductive substrate 11 serving as a bottom electrode. Since the transparent, conductive layer 22 electrically communicates with the semiconductor layers therebelow, in the preferred embodiment, the application of a relatively thick insulating layer between the semiconductor layers and the transparent, conductive layer 22 can be used to divide the large area (one square foot) solar cell into a plurality (180) of small area segments thereof for reasons which will become clear hereinafter. This method of electrical insulation is the subject of a separate patent application, entitled ISOLATION LAYER FOR PHOTOVOLTAIC DEVICE AND METHOD OF PRODUCING SAME, filed simultaneously herewith, invented by Prem Nath and Masatsugu Izu and assigned to the assignee of the instant application. That method of insulation will be further detailed in the following paragraph only to the extent necessary to fully understand the instant disclosure.

The insulating material is applied over the surface area of fhe semiconductor layers so as to divide the surface thereof into a plurality of rows and columns of insulating material. When the transparent, conductive layer 22 is subsequently deposited onto the surface of the semiconductor layers, it can only electrically communicate with those segments not covered by insulating material. Electrically-isolated, electrically-insulated, portions of semiconductor material may be thereby fabricated.

Figure 2A:
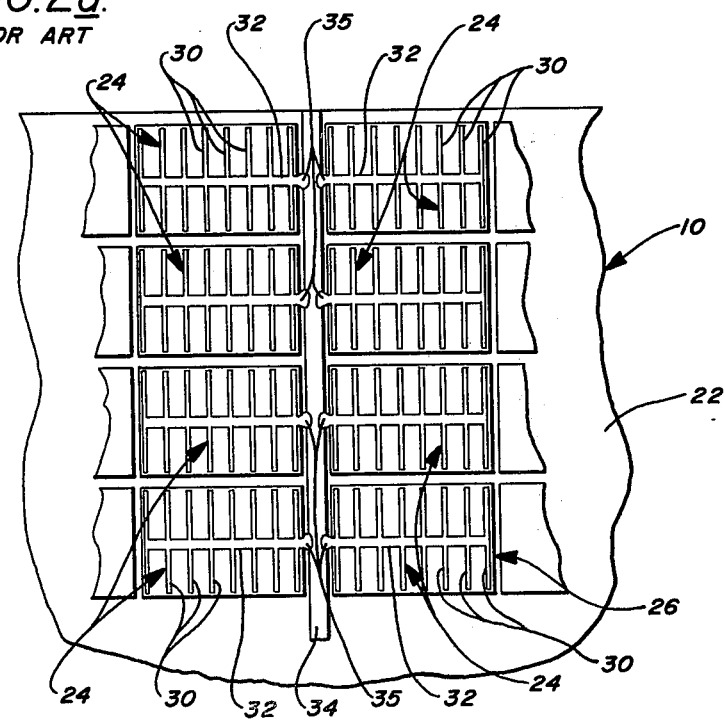
FIG. 2a is a fragmentary top plan view illustrating one prior art method of electrically interconnecting the plurality of small area segments, with grid patterns formed thereon, to provide an electrically-connected, large area photovoltaic cell.

II. The Grid Pattern and Electrical Connection of Isolated Segments of A Large Area Solar Cell FIG. 2a is a fragmentary view of the upper surface of the transparent, conductive coating 22 applied atop the semiconductor layers of the solar cell 10. As can be readily determined from that figure, the surface area of the semiconductor layers of the solar cell material 10 may be divided into a plurality of electrically-isolated segments 26 in any one of a plurality of methods which will be described hereinafter. Although the exact number and arrangement of the isolated segments 26 of the solar cell 10 may vary, in the preferred embodiment, twelve (12) parallel rows of fifteen (15) isolated segments 26 (a total of one hundred-eighty subcells) define the surface area of each large area (one square foot) solar cell. The term "isolated segment" is defined herein as a small surface area segment of a large area solar cell which is electrically-isolated from other segments of the surface area of the large area solar cell, but which shares a common substrate or electrode with those other segments.

The isolated segments 26 are formed, in the preferred embodiment, by discrete portions of the transparent, conductive coating 22 deposited atop the semiconductor layers of the solar cell material 10. Each isolated segment 26 may also be formed from the transparent, conductive coating 22 by other known methods such as photolithography and chemical etching. For instance, a photoresist solution may be applied to the surface of the transparent, conductive coating 22 and pre-heated to dry off solvents, thus leaving a thin film as a residue. A photomask, having a pattern corresponding to the pattern of isolated segments 26, to be formed, is then laid over the residual film, and those portions of the film not covered by the pattern are exposed to electro-magnetic radiation, typically in the ultra-violet region of the spectrum, or to a beam of electrons of appropriate energy to develop the film. During the development of the film, using conventional chemical or plasma procedures, the exposed portions (positive resist) or the unexposed portions (negative resist) of the film and the underlying transparent, conductive coating 22 are removed. The residual photoresist film is washed with a solvent to remove same from the surface of the transparent, conductive coating 22. A grid pattern 24 may now be applied onto the surface of the now isolated segments 26 of the transparent, conductive coating 22.

Figure 2B:
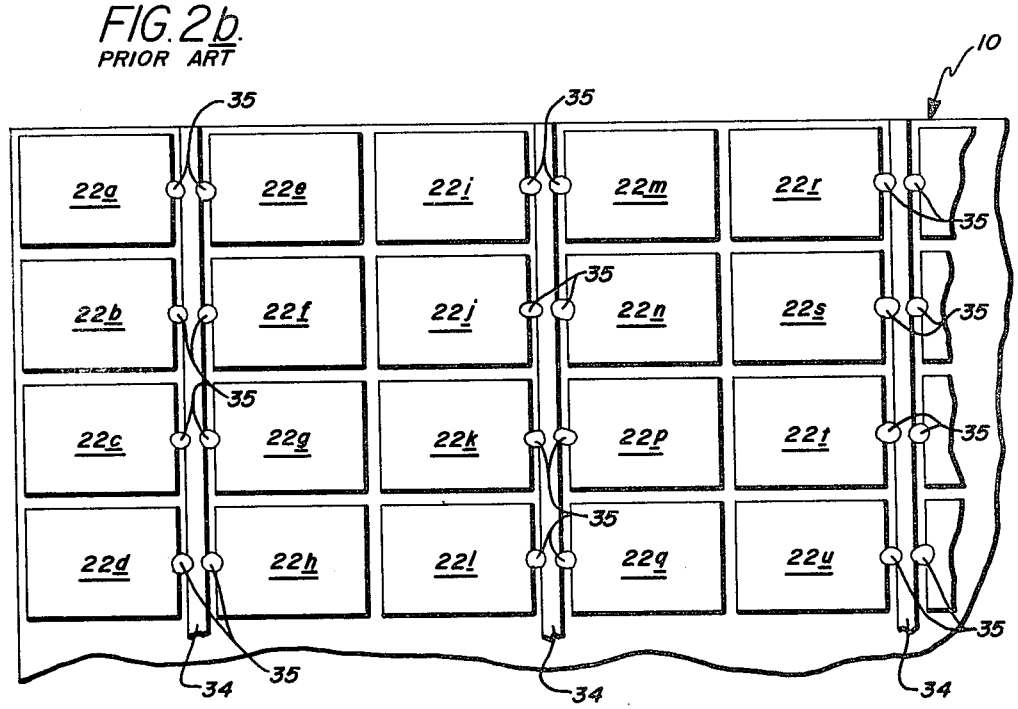
FIG. 2b is a fragmentary top plan view illustrating the electrically-isolated, small area segments of FIG. 2a before the application of grid patterns thereonto.

In the embodiment illustrated in FIG. 2b, the isolated segments 26 of the solar cell material 10 can be formed by dividing the transparent, conductive coating 22 into a plurality of discrete segments 22a-22u without applying a grid pattern thereonto. It is to be understood that for purposes of this description, the numeral 26 will refer to isolated segments of the transparent, conductive coating with a grid pattern applied thereonto, while the numerals 22a-22u refer to isolated segments of the transparent, conductive coating 22 not having the grid pattern applied thereonto. The discrete segments 22a-22u may be formed either by originally depositing the transparent, conductive coating 22 in a discontinuous fashion, as by the application of the insulating material as previously described, or by depositing a continuous transparent, conductive coating 22 and then removing intermediate parts of the photolithography and etching techniques previously described. Note that the electrically-insulating material may be applied atop the semiconductor layers by means of screen printing or other known techniques.

Each isolated segment, whether formed by a continuous or discontinuous transparent, conductive coating may have a grid pattern 24 applied thereonto. The width dimension of each grid pattern 24 is defined by a plurality of substantially equally spaced, relatively thin, parallel, electrically-conductive lines 30 radiating perpendicularly from both sides of a tapered, relatively thick, electrically-conductive, busbar-connecting line 32 which defines the length dimension of the grid pattern 24. The total width of each isolated segment 26 is about three-quarters (¾) of an inch and the total length of each isolated segment 26 is about one (1) inch. The grid patterns 24 are formed so as to maximize the current collected from the solar cell material while minimizing the amount of light presented from entering the solar cell material. It should be readily apparent to one ordinarily skilled in the art that the arrangement of isolated segments 26, the length and width dimensions of the grid patterns 24 and the isolated segments 26, the number of parallel lines 30, the number of parallel rows of the isolated segments 26, the total number of isolated segments 26 formed on a large area solar cell and hence, the size and configuration of that solar cell may vary without departing from the spirit and scope of the present invention. Whatever arrangement is selected, the grid patterns 24 may be printed, by any well known technique, such as screen printing, onto the transparent, conductive segments 26 with an electrically conductive material such as silver paste.

While two methods of forming the isolated segments 26 of the solar cell material have been described, other well known methods of "scribing" those isolation segments are within the scope of the present invention. Moreover, when used herein, the term "scribing" is intended to encompass all such methods of removing the transparent, conductive coating 22, which include, but are not limited to: (a) chemical etching; (b) plasma etching; (c) various laser techniques; (d) a waterjet technique; or (e) applying the transparent, conductive coating with a mask to form said distinct, discontinuous segments.

If desired, each isolated segment of the solar cell material 10 may be individually tested to determine whether the electrical output therefrom is sufficient to render it "electrically operative" or "electrically operable". As used within the context of the instant application, the terms "electricaly operative isolated segment" or "electrically operable isolated segment" refer to those isolated segments 26 of the solar cell material 10 which provide satisfactory electrical output. The electrical connection of isolated segments 26 of the solar cell material 10 providing unsatisfactory electrical output reduces the overall efficiency of the solar cell material. Further, since the isolated segments 26 of large area solar cells are connected in parallel, the electrical connection of any isolated segment 26 on a large area solar cell providing a very low voltage output could significantly decrease the electrical output of the entire large area solar cell 10.

While it is currently necessary to divide the large area cells into small area segments due to the existence of short circuits or other defects which, if electrically-connected to operable segments, would harm or destroy the efficiency of the overall cell, it is foreseeable (especially in view of recent "short-healing" technology) that those defects can be eliminated. If the defects are eliminated, there would be no need to divide the large area cell into small area segments. Further, for certain applications (powering calculators), the size of large area cells may not be large enough to warrant further division into smaller segments. Accordingly, the electrical connections disclosed herein are not limited to large area solar cells, which include small area segments, but may also be used with undivided large area cells.

A plurality of elongated, copper, electrically-conductive busbars 34 are affixed to the surface of the semiconductor layers with an electrically-insulating silicon adhesive. The silicon adhesive is applied as a very thin layer because the busbars 34 are to be positioned between alternate rows of isolated segments 26 of the solar cell material. In other words, even after the busbars 34 are affixed to the solar cell material 10, a lateral gap must remain between the adjacent discrete segments 26 of the transparent, conductive coating 22 and the associated busbar 34. In a preferred embodiment, wherein twelve rows of isolated segments 26 are provided, six conductive busbars 34, about 1/10 of an inch wide and 0.03 of an inch thick, are employed. The busbar-connecting line 32 from each electrically-operative isolated segment 26 of the solar cell material is electrically-connected to an adjacent busbar 34 using a dot of electrically-conductive material such as silver paste 35. Those isolated segments 26 whose electrical output falls below the selected minimum satisfactory level remain electrically-isolated, by the insulating silicon adhesive, from the electrically-conductive copper busbar 34.

The foregoing sequence may be reversed and, in fact, once the incidence of electrically-operative, isolated segments 26 routinely exceeds a predetermined level, the testing step may be omitted. In such cases, it is actually desirable to reverse the sequence and adhesively secure the copper busbars 34 to the surface of transparent, conductive coating 22 prior to printing the grid patterns 24 onto the isolated segments 26. This reversed sequence is preferably because the grid patterns 24 and the electrical connections thereof to the copper busbars 34 may be simultaneously accomplished. Although the sequence is not important from an operational standpoint, it is significant from an assembly line standpoint where the elimination of a step can represent important economic gains.

III. Electrically Interconnecting the Busbars

Figure 3A:
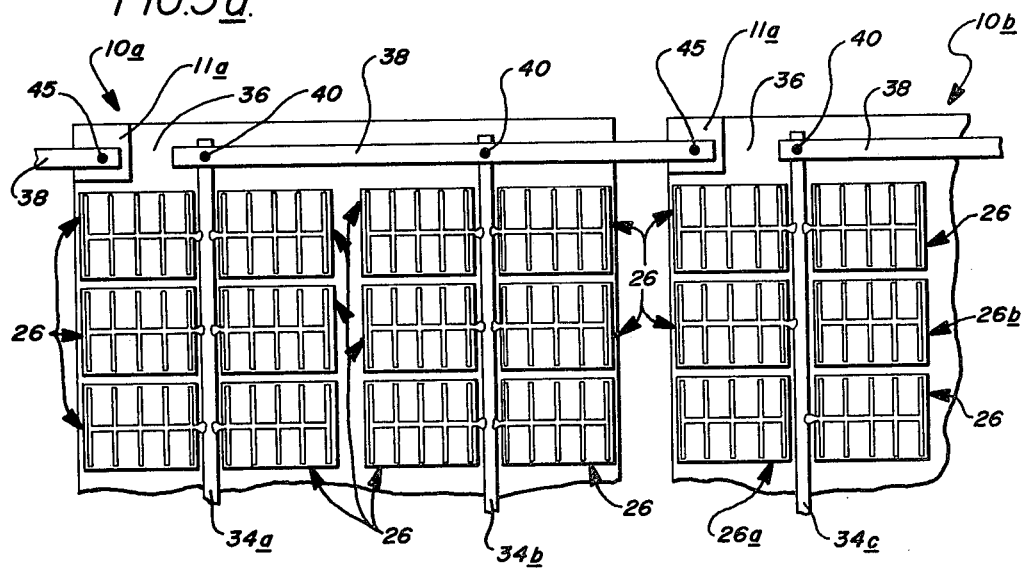
FIG. 3a is a fragmentary top plan view illustrating a first embodiment of the present invention in which an insulated metallic strip electrically interconnects adjacent large area photovoltaic cells, said cells being connected in series.
Figure 3B:
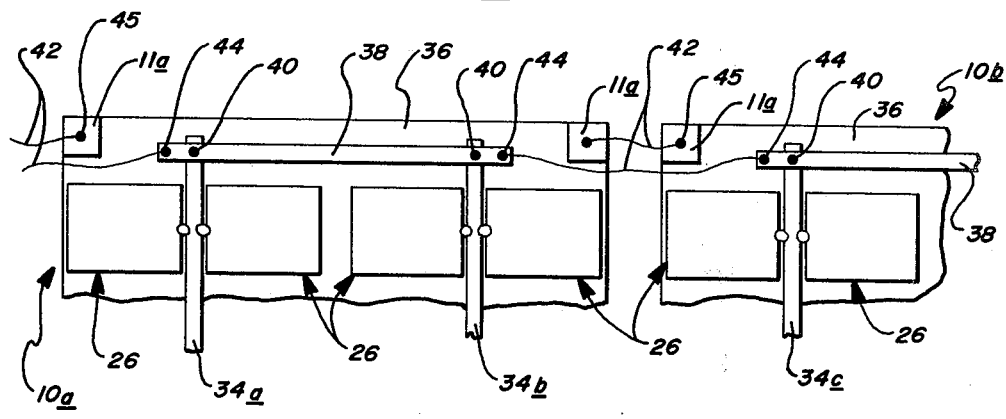
FIG. 3b is a fragmentary top plan view illustrating the embodiment of the present invention shown in FIG. 3a as modified to provide a parallel connection of the large area cells.
Figure 4A:
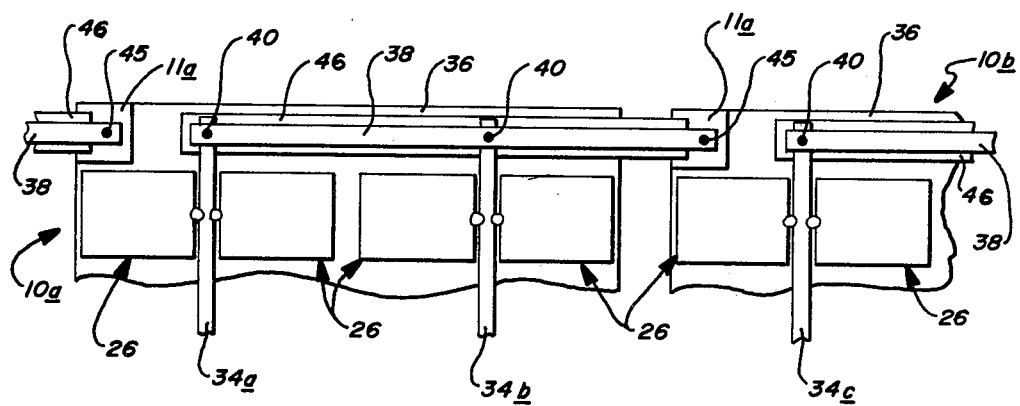
FIG. 4a is a fragmentary, top plan view illustrating a second embodiment of the present invention in which an uninsulated metallic strip electrically interconnects adjacent large area photovoltaic cells, said cells being connected in series.

FIGS. 3a, 3b, 4a, bb, 5a and 5b are fragmentary views illustrating the top surface of adjacent large area photovoltaic cells 10 and specifically showing the manner in which said large area cells are electrically interconnected pursuant to the teachings of this invention. More particularly, depicted therein are portions of electrically interconnected large area photovoltaic cells such as 10a and 10b, and in the case of FIGS. 5a and 5b, cell 10c. Although different methods of connecting these large area cells are shown in the Figures, the same reference numeral will depict common elements in each of the embodiments. It is to be understood that each of the photovoltaic cells 10 are preferably formed of a plurality of electrically isolated, small area segments which will be generally referred to by the reference numeral 26. Although each electrically-isolated segment 26 is capable of functioning as a photovoltaic device independent of every other segment 26, the present invention deals with the electrical interconnection of (1) these electrically-isolated segments 26 to obtain an overall electrical output from the large area solar cell 10 which is the sum of the output of each isolated segment 26, and (2) adjacent large area solar cells, such as 10a and 10b, to obtain an electrical output which is the sum of the output of each electrically-interconnected large area cell, such as 10a and 10b.

Figure 4B:
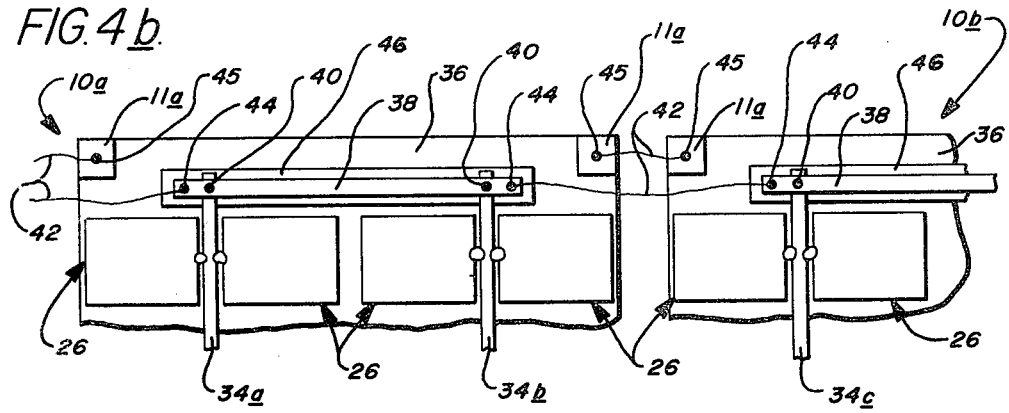
FIG. 4b is a fragmentary top plan view illustrating the embodiment of the present invention shown in FIG. 4a as modified to provide a parallel connection of the large area cells.
Figure 5A:
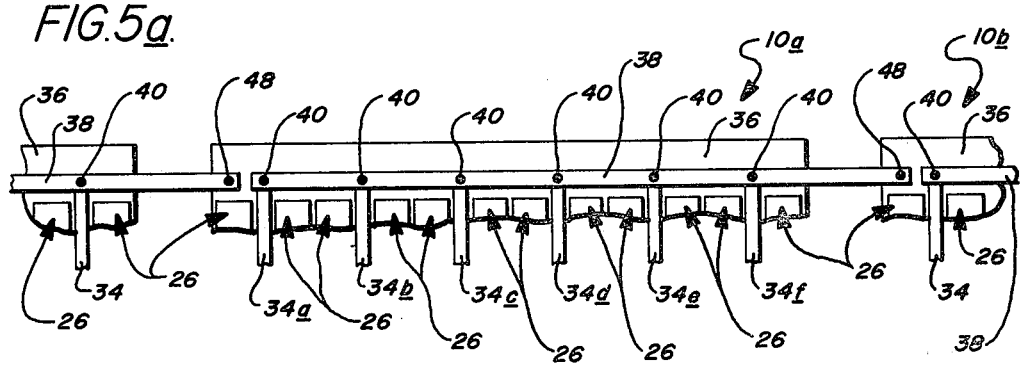
FIG. 5a is a fragmentary, top plan view illustrating a third embodiment of the present invention in which an insulated metallic strip and rivets electrically interconnect adjacent large area photovoltaic cells, said cells being interconnected in series.
Figure 5B:
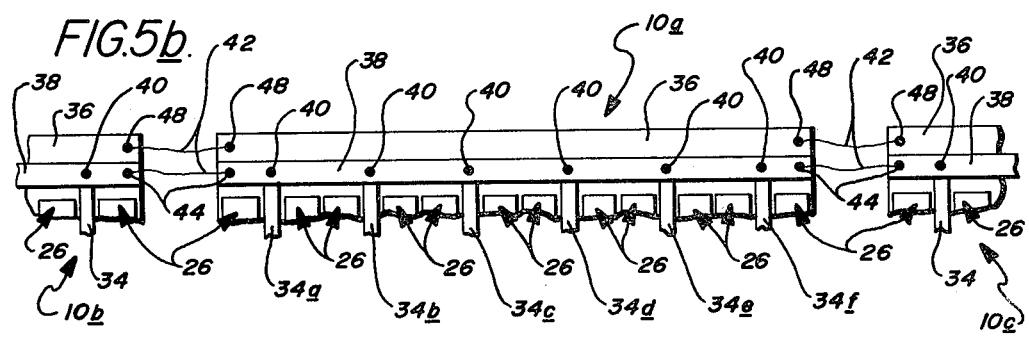
FIG. 5b is a fragmentary, top plan view illustrating the embodiment of the present invention shown in FIG. 5a as modified to provide a parallel connection of the large area cells.
Figure 6:
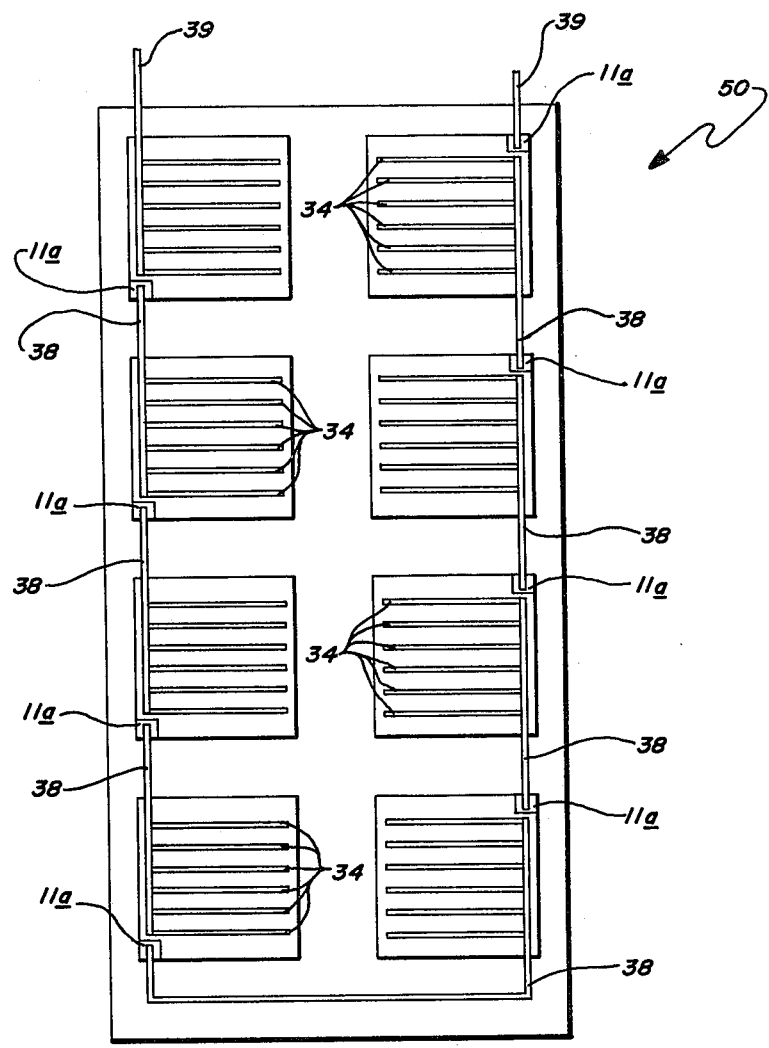
FIG. 6 is a top plan view of a panel of photovoltaic cells formed by electrically interconnecting, in series, the adjacent large area photovoltaic cells.

Note that in FIG. 3a, electrically inoperative segments of the large area photovoltaic cells 10a and 10b are not connected to the busbars 34a, 34b and 34c but rather, they are left electrically isolated. Specifically, in cell 10b, segments 26a and 26b are electrically inoperative and consequently have not been connected to busbar 34c. Note further that, while FIGS. 3a, 3b, 4a and 4b illustrate only two busbars 34a and 34b connecting the electrically-isolated segments 26 of large area solar cell 10a, this is merely for convenience in understanding and economy of space in this description. In the actual practice of the invention, cell 10a would be composed of a greater number (180) of electrically-isolated segments linked by a greater number (6) of the busbars 34. These six busbars 34a-34f are shown in the embodiment of FIGS. 5a and 5b.

As can be seen from the preferred embodiments illustrated in each of the FIGS. 3a-5b, the end of each of the copper busbars 34 extends beyond the periphery of the active area of each large area photovoltaic cell and terminates on an upper peripheral border portion 36. For purposes of this disclosure, (1) "active area" is defined as that portion of the large area photovoltaic cell 10 which includes electrically communicating substrate, semiconductor and transparent, conductive coating layers, and (2) the "same portion" of the large area cell 10 is defined as any continuous segment of the surface of the cell without regard to shape or size. An electrically-insulating layer of any well known type must be applied below the busbars 34 on the border portion 36 to be sure that (1) said portion 36 is electrically "inactive", and (2) the busbars 34 do not electrically contact and consequently short circuit current to the substrate 11. The electrically-insulating layer may be applied in any well known manner, such as by depositing an insulating coating simultaneously with the application of the electrically-insulating material which forms the electrically-isolated small area segments of each of the large area cells 10.

Having electrically interconnected the electrically-operable, electrically-isolated segments 26 of the large area photovoltaic cells 10a and 10b, to the busbars 34a, 34b and 34c, respectively, and having electrically insulated those busbars from the substrate 11 on the electrically insulated peripheral border portion 36 of the cells 10a and 10b, it is necessary to electrically interconnect the busbars of each large area cell in order to provide a single electrode therefrom. The lower or base electrode of each large area photovoltaic cell such as, 10a and 10b, is provided by the common substrate 11.

More specifically, the electrically-isolated segments 26 of the large area cell 10a share a common base electrode or substrate 11. For convenience of electrical interconnection and commercial production, in the first and second preferred embodiments illustrated in FIGS. 3a, 3b, 4a and 4b, a section 11a of the upper left hand corner of the upper peripheral border portion 36 of the large area photovoltaic cell 10a is exposed and is therefore adapted to provide electrical access to the common substrate 11. In FIGS. 3b and 4b, two distal sections 11a of the peripheral border portion 36 are exposed to provide electrical access to the common substrate 11. The exposed substrate sections 11a may be formed by burnishing the previously deposited semiconductor layers, or they may be formed by masking a portion of the peripheral border during the deposition of semiconductor layers, or by etching those semiconductor layers from the substrate, or by any other commonly employed technique. Note that electrical access to the substrate is provided in FIGS. 5a and 5b by plated copper rivets 48. The copper rivets preferably include serrated washers for establishing good electrical contact with the substrate 11. One such rivet 48 is secured to each large area cell 10a, 10b and 10c for the series connection shown in FIG. 5a, while two rivets 48 are secured to the large area cells 10a, 10b and 10c for the parallel connection shown in FIG. 5b.

A. Insulated Strip and Exposed Substrate

Electrical interconnection of the busbars 34a and 34b of large area cell 10a is accomplished, in the first embodiment of FIGS. 3a and 3b, by a means of an electrically-insulated, conductive metallic strip 38. In its most preferred form, this strip comprises an inner metallic core made of an electrically-conductive material such as nickel-plated copper, protected by a surrounding, electrically-insulating jacket such as glass-filled teflon, polyvinylchloride, vinylacetate, or other like flexible, dielectric material. The advantage of the insulating jacket is the added security it provides against the possibility of short circuiting.

In the embodiment of FIGS. 3a and 3b, a length of the conductive strip 38 is electrically connected to the busbars 34 by punching holes through the strip 38 at positions, which, when the strip is applied atop the peripheral border portion 36 of the large area cell 10a, will present the metallic core thereof to each busbar 34a and 34b. In other words, the holes in the conductive strip 38 are formed to directly overlie each busbar 34 of each large area cell 10. The strip 38 is then securely electrically connected to each of the busbars, 34a and 34b, on that large area cell, such as 10a, by means of a solder joint 40. In an identical manner, the busbars, such as 34c of large area cell 10b, are electrically interconnected by a length of conductive strip 38. In an alternative embodiment, the portion of the insulating jacket of the strip 38 immediately overlying each of the busbars may be stripped away and the exposed, conductive core thereof directly fastened, as by soldering, to the busbars.

Moving now to the embodiment viewed in FIG. 3b, regardless of the manner in which the conductive core of the metallic strip 38 is exposed, electrically-conductive metallic wires 42 may be soldered, as at 44, to each of the ends of those strips 38, the conductive core having first been exposed at said ends. Similarly, the metallic wires 42 may be electrically connected, as by weld joints 45, to the exposed sections 11a of substrate 11. In this manner, the adjacent large area cells 10a and 10b shown in FIG. 3b are adapted for parallel interconnection. The parallel connection will be further described in a later paragraph.

B. Conductive Strip and Exposed Susbstrate

In the second prefered embodiment, shown in FIGS. 4a and 4b, electrical interconnection of the busbars 34a and 34b of the large area solar cell 10a is accomplished by means of an electrically-conductive, uninsulated metallic strip 38. While this strip 38 is readily connected to the busbars 34a and 34b by soldering, a thin electrically-insulating tape 46 must first be placed onto the peripheral border portion 36 to insure that the uninsulated surface of the conductive strip 38 does not short circuit current to the substrate 11.

As with the embodiment of FIG. 3b, FIG. 4b shows electrically-conductive, metallic wires 42 soldered, as at 44, to each end of the strips 38. Similarly, the metallic wires 42 are welded to the exposed sections 11a of substrate 11. In this manner, the adjacent large area photovoltaic cells 10a and 10b shown in FIG. 4b are adapted for parallel interconnection. This parallel interconnection will be detailed in a later paragraph.

C. Insulated Tape and Riveted Substrate

Referring now to FIGS. 5a and 5b, a still further embodiment of the present invention is illustrated. In this embodiment, electrical interconnection of the busbars 34a–34f of the large area solar cell 10a is accomplished by means of an electrically-insulated, electrically-conductive, metal strip 38. The strip 38, as previously described with reference to the embodiment of FIGS. 3a and 3b, includes a metallic core made of an electrically-conductive material such as copper, protected by a surrounding, electrically-insulating jacket such as Teflon, etc. However, unlike the embodiment disclosed with respect to FIGS. 3a and 3b, electrical access to the substrate 11 is provided by at least one plated copper rivet 48 which is secured, within the peripheral border portion 36, to each large area cell 10. Only one rivet 48 need be secured to the large area cell 10 for series connection of adjacent large area cells 10, while two rivets are secured for the parallel interconnection thereof.

A length of the conductive strip 38 is electrically connected to the busbars 34a–34f of large area cell 10a by punching holes through the strip 38. More particularly, the holes are punched at positions, which, when the strip is applied atop the peripheral border portion 36 of the large area cell 10a will present the metallic core thereof to said busbars 34a–34f. The strip 38 is then securely electrically connected to the busbars by means of a solder joint 44. In an identical manner, the busbars 34 of the adjacent large area cells 10b and 10c are electrically interconnected by a length of conductive strip 38. In an alternate embodiment, the portion of the insulating jacket of the strip 38 immediately overlying each of the busbars may be stripped away and the exposed, conductive core thereof soldered directly to the busbars.

For purposes of providing parallel electrical interconnections, between the adjacent large area cells 10a, 10b and 10c, electrically conductive metallic wires 42 may be soldered, as at 44, to each of the ends of the conductive strips 38, the conductive core having first been exposed at said ends. Similarly, the metallic wires 42 may be electrically connected to the opposed copper plated rivets, see FIG. 5b.

While not shown, it should be readily apparent that the rivets 48 could be replaced by exposed sections 11a of the substrate 11 to which the metallic wires 42 would be welded without departing from the spirit or scope of the instant invention.

The electrically-interconnected large area photovoltaic cell 10 is thereby provided with (1) a first electrode in the form of one or more of the exposed portions 11a of the substrate 11, or one or more conductive rivets 48, and (2) a second electrode formed by the electrically-conductive strip 38 which electrically-interconnects the plurality of copper busbars 34, which in turn, electrically connect the plurality of isolated small area segments 26 of each large area cell 10.

IV. Electrically Interconnecting Adjacent Large Area Photovoltaic Cells

In order to electrically interconnect adjacent large area photovoltaic cells, it is necessary to electrically interconnect the electrodes extending from said adjacent cells. This interconnection may be advantageously accomplished by means of an elongated piece of the electrically-conductive strip 38 discussed hereinabove. In those instances in which the strip 38 interconnects discrete large area photovoltaic cells, it is preferred, but by no means essential, that the strip be electrically insulated to prevent shorting as the strip 38 passes over the edges 42 between those adjacent large area cells 10.

A. The Series Interconnection

More particularly and referring specifically to the embodiments illustrated in FIGS. 3a, 4a and 5a, electrical interconnection of one large area photovoltaic cell 10a to an adjacent large area photovoltaic cell 10b (and in the case of FIG. 5a, also to cell 10c) is preferably accomplished in a series mode by fastening the conductive strip 38, which electrically interconnects the busbars 34a and 34b of said large area cell 10a, to the substrate electrode of the adjacent large area cell 10b. The substrate electrode is either the exposed section 11a of the substrate 11, as in the embodiment of FIGS. 3a and 4a, or the plated rivet 48 as in the embodiment of FIG. 5a. Since the substrate is formed from stainless steel, the conductive strip 38 must be spot welded to the exposed section 11a thereof, when the exposed substrate embodiment is employed. Note, however, that if the substrate is plated, soldering methods may be employed. The conductive strip 38 is fastened to the substrate 11 by means of the plated rivet 48 in those instances in which the photovoltaic cell is likely to receive an extensive amount of abuse. Of course, when the plated rivet is used, the exposed head thereof should be leveled, by filing or sanding, so as to present a smooth exterior profile and thereby eliminate bubble and stress formation which would otherwise occur during the encapsulation process.

B. The Parellel Interconnection

Turning now to the embodiments illustrated in FIGS. 3b, 4b and 5b, the parallel interconnection of one large area photovoltaic cell 10a to an adjacent large area photovoltatic cell 10b is depicted. In the embodiment illustrated by FIG. 5b, the large area photovoltaic cell 10a is shown electrically interconnected in parallel to the adjacent large area photovoltaic cells 10b and 10c.

The parallel interconnection of the FIGS. 3b, 4b and 5b embodiments are substantially identical. The only differences are that (1) the electrically-insulating layer, FIG. 4b embodiment, is applied along the peripheral border portion 36 of each large area cell 10 prior to electically connecting the uninsulated, conductive strip 38 to the busbars 34, and (2) the metallic wire leads 42 are secured to the plated copper rivets 48 in the FIG. 5b embodiment, rather than to the exposed section of the substrate 11 as in the FIGS. 3b and 4b embodiments. Once the conductive strips 38 and the metallic wire leads 42 have been electrically connected to the discrete large area cells 10, the electrical parallel interconnection of adjacent ones of those cells is identical regardless of the embodiment.

More particularly, the parallel interconnection is accomplished by electrically joining, by solder or solderless connection, the metallic wire lead 42 from the substrate and from the conductive strip 38 of one large area cell, such as 10a, to the metallic wire lead 42 from the substrate and from the conductive strip 38 of the adjacent large area cell, such as 10b. Note that it is necessary to use two wire leads 42 from each side of the large area cell 10 if that large area cell has been or will be encapsulated prior to electrical interconnection with an adjacent large area cell. In those instances in which the large area cells are to be encapsulated by protective coverings after electrical interconnection, each of the adjacent large area cells 10 need only be provided with one of the two requisite wire leads 42. More particularly and viewing FIG. 3b, large area cell 10a may be provided with the wire lead 42 connected to the conductive strip 38 and large area cell 10b may be provided with the wire lead 42 connected to the exposed section 11a of the substrate 11. The electrical interconnection of the large area cells 10a and 10b is accomplished by (1) soldering the wire lead from the conductive strip of cell 10a to the conductive strip of cell 10b, and (2) welding the wire lead from the exposed substrate section 11a of cell 10b to the exposed substrate section 11a of the cell 10a. The adjacent, electrically-interconnected large area cells 10a and 10b may now be encapsulated.

Note that although wire leads 42 are shown and described as electrically interconnecting adjacent conductive strips 38 of adjacent large area cells 10, the electrical interconnection between the busbars 34 of adjacent large area cells 10 could be accomplished by a single, continuous length of the electrically-conductive strip 38 without departing from the spirit or scope of the invention.

V. The Panel

Utilizing the techniques detailed hereinabove, an electrically-interconnected photovoltaic panel 50 may be assembled from a plurality of discrete, electrically-interconnected, large area photovoltaic cells. Typically, such panels 50 comprise a four foot long by two foot wide matrix of electrically-interconnected solar cells.

Obviously, any number of large area photovoltaic cells 10 can be electrically interconnected to form a panel 50. The number of large area cells 10 employed is dependent upon the power requirements of the consumer. Once the preselected number of photovoltaic cells 10 are electrically interconnected to form a photovoltaic panel 50 adapted to supply a given amount of power, the entire panel may be encapsulated in protective lamination. The protective lamination will assure ease of handling, durability and protection from the elements. A technique for fabricating a laminated strip of lightweight, spaced, electrically-interconnected large area solar cells which employs, in the preferred embodiment thereof, the electrical connecting technique disclosed herein, is a U.S. patent application Ser. No. 440,384, filed on even date herewith and entitled Laminated Strip of Large Area Solar Cells and Method of Producing That laminated Strip, said application assigned to the assignee of the instant patent application. Regardless of the encapsulating process which is employed, it is preferred that the large area cells 10 are electrically connected in series by conductive strips 38, the ends 39 of which provide electrodes extending from the panel 50. These electrodes are available for electrical connection to another panel 50 or to supply power for the consumer.

It should be understood that the present invention is not limited to the precise structure of the illustrated embodiments. It is intended that the foregoing description of the presently preferred embodiment be regarded as an illustration rather than as a limitation of the present invention. It is the following claims, including all equivalents, which are intended to define the scope of the invention.

What we claim is:

1. In a large area photovoltatic cell which comprises a plurality of electrically isolated small area segments sharing a common electrically-conductive substrate upon which a plurality of continuous semiconductor layers are deposited, each small area segment defined by a discrete portion of a transparent conductive coating atop the semiconductor layers, whereby each small area segment is electrically isolated from other small area segments; and a plurality of spaced, electrically-conductive busbars disposed atop and electrically connected to the plurality of small area segments; the improvement comprising, in combination;

each of the busbars terminating on the same portion of the surface of the large area cell;

an electrically insulating layer between the busbars and the surface therebeneath to prevent short circuiting;

an electrically-insulating layer between the busbars and the busbar terminating portion of the large area cell to prevent short circuiting;

first connecting means for electrically interconnecting each of the plurality of spaced busbars; and at least one means for providing electrical access to the common substrate from the layered surface of the large area cell, whereby the first connecting means provides a first electrode of the large area photovoltaic cell and the access means provides a second electrode of the large area photovoltaic cell.

2. A cell as in claim 1, wherein at least one exposed section of the layered substrate surface provides the a second electrode, whereby both electrodes of the large area photovoltaic cell are provided on the upper surface thereof.

3. A cell as in claim 1, wherein at least one electrically-conductive rivet is secured to the large area cell to electrically communicate with the substrate.

4. A cell as in claim 1, wherein the busbars terminate within a peripheral border portion of the large area photovoltaic cell.

5. A cell as in claim 4, wherein the peripheral border of the large area cell is approximately ⅜ of an inch wide.

6. A cell as in claim 4, wherein at least one section of the substrate is exposed along said peripheral border portion of the large area cell, said at least one section providing the said at least one substrate access means.

7. A cell as in claim 6, wherein two sections of the substrate are exposed to provide for parallel connection of the large area cell.

8. A cell as in claim 6, wherein one section of the substrate is exposed to provide for series connection of the large area cell.

9. A cell as in claim 4, wherein at least one electrically-conductive rivet is secured to the peripheral border portion of the large area cell, said at least one rivet providing the said at least one substrate access means.

10. A cell as in claim 9, wherein two rivets are secured to provide for parallel connection of the large area cell.

11. A cell as in claim 9, wherein one rivet is secured to provide for series connection of the large area cell.

12. A cell as in claim 4, wherein the first connecting means is a single, elongated, metallic strip which electrically connects the busbars.

13. A cell as in claim 12, wherein the metallic strip is soldered to each of the busbars and a metallic wire is electrically connected to each of the electrical access means.

14. A cell as in claim 13, wherein the large area photovoltaic cell and electrical intraconnections thereof are encapsulated between upper and lower protective coverings with only the connections to the electrodes thereof extending from the protective coverings.

15. A cell as in claim 13, wherein one electrical access means is provided and the large area cell is adapted for series connection.

16. A cell as in claim 13, wherein two electrical access means are provided and a discrete metallic wire is connected to each of the electrical access means to provide for parallel connection of the large area cell.

17. Electrically interconnected large area photovoltaic cells, each cell comprising a plurality of electrically-isolated, small area segments which share a common electrically conductive substrate upon which a plurality of continuous semiconductor layers are deposited; a plurality of spaced, electrically-conductive busbars disposed atop and electrically insulated from the surface therebeneath, said busbars electrically interconnected to the small area segments of said discrete large area cells; each small area segment defined by a discrete portion of a transparent, conductive coating atop the semiconductor layers, whereby each small area segment is electrically isolated from other small area segments; and wherein each of the busbars of each large area cell terminating on the same portion of the surface of the associated large area cell; said electrically interconnected cells comprising, in combination:
an electrically insulating layer applied to the busbar terminating portion of each large area cell to prevent short circuiting;
first connecting means for electrically connecting the busbars of each discrete large area cell;
at least one means for providing electrical access to the common substrate of each large area cell from the layered surface of each large area cell; and
said electrical access means and said first connecting means of adjacent large area cells being electrically interconnected to interconnect said adjacent large area cells.

18. Interconnected cells as in claim 17, wherein the busbars of each discrete, large area cell terminate within a peripheral border portion thereof.

19. Interconnected cells as in claim 18, wherein the said at least one electrical access means of each large area cell is provided within the peripheral border portion of that large area cell.

20. Interconnected cells as in claim 19, wherein the said at least one electrical access means of each large area cell comprises at least one electrically-conductive rivet secured to the peripheral border portion of that cell.

21. Interconnected cells as in claim 20, wherein each large area cell has two rivets secured thereto, whereby said adjacent large area cells are electrically interconnected in parallel.

22. Interconnected cells as in claim 20, wherein each large area cell has one rivet secured thereto, whereby said adjacent large area cells are electrically interconnected in series.

23. Interconnected cells as in claim 19, wherein the said at least one electrical access means of each large area cell comprises at least one exposed section of the layered substrate surface, said section exposed within the peripheral border portion of that large area cell.

24. Interconnected cells as in claim 23, wherein each large area cell has two sections of the substrate exposed, whereby said adjacent large area cells are electrically interconnected in parallel.

25. Interconnected cells as in claim 23, wherein each large area cell has one section of the substrate exposed, whereby said adjacent large area cells are electrically interconnected in series.

26. Interconnected cells as in claim 19, wherein the first connecting means of each large area cell is soldered to the busbars of that cell to provide a first electrode of the large area cells.

27. Interconnected cells as in claim 26, wherein the first connecting means of each large area cell comprises a single, elongated metallic strip.

28. A method of providing electrical connections to and from a large area photovoltaic cell, the cell comprising: (1) a plurality of electrically-isolated, small area segments sharing a common electrically conductive substrate upon which a plurality of continuous semiconductor layers are deposited; each small area segment defined by a discrete portion of a transparent, conductive coating atop the semiconductor layers: and (2) a plurality of spaced, electrically-conductive busbars disposed atop and electrically insulated from the surface therebeneath, said busbars electrically connected to the small area segments: the method comprising the steps of:
terminating each busbar within the same portion of the large area cell;
electrically insulating said busbar terminating portion of the large area cell to prevent short circuiting;

providing at least one electrical access means to the common substrate from the layered surface of the large area cell with electrical access means; and electrically interconnecting the busbars of the large area cell with first connecting means; whereby the first connecting means provides a first electrode of the large area photovoltaic cell and the electrical access means provides a second electrode of the large area photovoltaic cell.

29. A method as in claim 28, wherein the busbars are terminated within a peripheral border portion of the large area cell.

30. A method as in claim 29, wherein the step of providing said at least one electrical access means includes securing at least one electrically-conductive rivet to the peripheral border portion of the large area solar cell.

31. A method as in claim 30, wherein two rivets are secured and the large area cell is adapted for parallel connection.

32. A method as in claim 30, wherein one rivet is secured and the large area cell is adapted for series connection.

33. A method as in claim 29, wherein the step of providing said at least one electrical access means includes exposing at least one section of the layered substrate surface within the peripheral border portion of the large area cell.

34. A method as in claim 33, wherein two sections of the substrate are exposed and the large area cell is adapted for parallel connection.

35. A method as in claim 33, wherein one section of the substrate is exposed and the large area cell is adapted for series connection.

36. A method as in claim 29, wherein the step of electrically interconnecting the busbars includes the further step of soldering an electrically-conductive, metallic strip to each of the busbars.

37. A method as in claim 36, including the additional step of encapsulating the electrically-interconnected, large area photovoltaic cell between upper and lower protective coverings with only the connections to the electrodes extending from the coverings.

38. A method of electrically interconnecting adjacent large area photovoltaic cells, each cell comprising: (1) a plurality of electrically-isolated, small area segments sharing a common electrically conductive substrate upon which a plurality of continuous semiconductor layers are deposited, each small area segment defined by discrete portion of a transparent, conductive coating atop the semiconductor layers; and (2) a plurality of spaced, electrically-conductive busbars disposed atop and electrically insulated from the surface therebeneath, said busbars electrically connected to the small area segments; the method comprising the steps of:

terminating each busbar of a discrete large area cell within the same portion of that large area cell;

electrically insulating said busbar terminating portion of each large area cell to prevent short circuiting:

providing at least one electrical access means to the common substrate of each large area cell from the layered surface of that large area cell; and electrically interconnecting the busbars of each discrete large area cell with first connecting means; and electrically interconnecting the first connecting means and the electrical access means of said adjacent large area cells to electrically interconnect said adjacent large area photovoltaic cells.

39. A method as in claim 38, wherein the busbars of each large area cell are terminated within a peripheral border portion of that cell.

40. A method as in claim 39, wherein the said at least one electrical access means of each large area cell is provided within the peripheral border portion of that cell.

41. A method as in claim 40, wherein the said at least one electrical access means of each large area cell comprises at least one electrically-conductive rivet secured to the peripheral border portion of that cell.

42. A method as in claim 41, wherein two rivets are secured to each large area cell, whereby said adjacent large area cells are electrically-interconnected in parallel.

43. A method as in claim 41, wherein one rivet is secured to each large area solar cell, whereby said adjacent large area cells are electrically interconnected in series.

44. A method as in claim 40, wherein the said at least one electrical access means of each large area cell comprises at least one exposed section of the layered substrate surface, said exposed section within the peripheral border portion of that cell.

45. A method as in claim 44, wherein two sections of the substrate are exposed, whereby said adjacent large area cells are electrically interconnected in parallel.

46. A method as in claim 44, wherein one section of the substrate is exposed, whereby said adjacent large area cells are electrically interconnected in series.

47. A method as in claim 38, wherein the step of electrically interconnecting the busbars of each large area solar cell includes the further step of soldering an electrically-conductive metallic strip to the busbars of each large area cell.

48. A method as in claim 47, including the additional step of encapsulating the electrically-interconnected, large area photovoltaic cells between upper and lower protective coverings.

* * * * *